United States Patent [19] [11] 4,387,006
Kajiwara et al. [45] Jun. 7, 1983

[54] METHOD OF TREATING THE SURFACE OF THE COPPER FOIL USED IN PRINTED WIRE BOARDS

[75] Inventors: Toshiyuki Kajiwara; Katsuhito Fukuda, both of Kyoto; Yoshinori Tanii, Oumihachiman, all of Japan

[73] Assignee: Fukuda Metal Foil & Powder Co., Ltd., Kyoto, Japan

[21] Appl. No.: 281,510

[22] Filed: Jul. 8, 1981

[51] Int. Cl.$^3$ .................. C25D 5/34; C25D 5/48; C25D 7/06

[52] U.S. Cl. .................. 204/32 R; 204/35 R; 204/38 R; 204/140

[58] Field of Search .............. 204/27, 35 R, 38 R, 204/43 Z, 140, 41, 32 R

[56] References Cited

U.S. PATENT DOCUMENTS

| | | | |
|---|---|---|---|
| 1,827,204 | 10/1931 | Mason | 204/140 |
| 3,585,010 | 6/1971 | Luce et al. | 428/608 |
| 3,625,844 | 12/1971 | McKean | 204/140 |
| 3,857,681 | 12/1974 | Yates | 204/27 |
| 4,131,517 | 12/1978 | Mitsuo | 204/27 |
| 4,260,449 | 4/1981 | Berdan | 204/27 |

FOREIGN PATENT DOCUMENTS 1328319 8/1973 United Kingdom .

Primary Examiner—T. M. Tufariello
Attorney, Agent, or Firm—Wenderoth, Lind & Ponack

[57] ABSTRACT

The present invention relates to a method of treating the surface of the copper foil used in printed wire boards, in which the copper foil, of which the surface thereof was preliminarily roughened, is electrolytically treated in an aqueous solution of zinc chromate containing zinc ions and chromium (VI) ions at a definite range of ratio; the thus-treated copper foil is then preferably immersed in an aqueous solution containing amino silane, sodium silicate and/or potassium silicate at a definite ratio.

The use of the so-treated copper foil in multi-layer glass/epoxy printed wire boards (NEMA grade, FR4, FR5) serves to prevent the generation of brown spottings and the elimination of the delamination of the copper conductors. In addition, the use of the so treated copper foil in flame resistant paper/phenol printed wiring boards (NEMA grade FR2) leads to the elimination of the poor adhesive properties and delamination of copper conductors.

8 Claims, No Drawings

METHOD OF TREATING THE SURFACE OF THE COPPER FOIL USED IN PRINTED WIRE BOARDS

Disclosure of the Invention

The present invention relates to a method of treating the surface of a copper foil, in particular a copper foil used in multi-layer glass epoxy printed wire boards (NEMA grade FR4, FR5) and flame resistant type printed wire boards (NEMA grade FR2).

A copper clad laminate consisting of a prepreg, such as an epoxy resin preimpregnated glass cloth, a phenol resin preimpregnated paper and the like, on which an electrodeposited copper foil is laminated has been widely used as printed wire boards. In particular, recently there is an increasing demand for glass epoxy FR4, FR5 grade-copper clad laminates containing a variety of flame retardants added therein in multi-layer printed boards and paper phenolic FR2 grade-copper clad laminates containing a variety of flame retardants incorporated into printed wiring boards for various electronic instruments, such as television and the like. New requirements of quality, different than that required for the prior copper clad laminates are necessary for the more recent copper clad laminates.

One of the most important problems in multi-layer printed boards is the development of brown spottings (discoloration) on the etched glass/epoxy substrate of multi-layer printed boards. These brown spottings are yellowish brown and greenish brown insoluble products which appear to be the result of reactions between the hardener added in the substrate and copper oxides and the like formed on the surface treated layer of the copper foil in contact with the substrate, because copper clad laminates are subjected to high temperature-high pressure treatment in a molding process.

Another important problem is the delamination of copper conductors in the soldering of printed boards, e.g., at 550F., or generally at high temperatures and high humidity.

The important problems in respect to the production of printed wire boards, in which paper phenolic FR2 grade-copper clad laminates are used, are poor adhesive properties of the flame resistant type paper phenolic-copper clad laminates containing flame retardant added therein or the delamination of copper conductors. The poor adhesive properties appear to be the result of the violent erosion of the surface treated layer of the copper foil remarkably decreases the effective adhesion area, because the copper clad laminates are molded at high temperature and high pressure or are subjected to various kinds of heat treatment in their manufacturing process to thermally activate halogenides and the like added the substrates as flame retardants.

In order to eliminate these problems, a method of forming thin barrier layers of metals selected from the group consisting of zinc, indium and brass (U.S. Pat. No. 3,585,010) and method in which the copper foil is electrolytically treated in an aqueous solution of chromic anhydride or chromate of alkaline metals (B.T.P. No. 1,328,319) have been invented.

However, these prior methods could not prevent the formation of brown spottings and the degeneration of adhesive properties due to the presence of flame retardants.

For example, although a thin zinc barrier layer clad copper foil is effective for the formation of brown spotting for a short term, it has the disadvantage of losing this function after about one month. Flame resistant paper phenolic FR2 grade-copper clad laminates containing halogenides as flame retardants, in which the thin zinc barrier layer clad copper foil is used, lower there peel strength to the extent of 1.0 kg/cm or less so as to be useless for printed wire boards after being subjected to soldering at 260° C. for 5 sec.

A method of using an aqueous solution of chromic anhydride or chromate of a alkaline metals in effective for improving the acid resistance and corrosion resistance, but not effective for preventing the peel strength from being lowered due to the flame retardants.

Accordingly, it is an object of the present invention to provide a method of treating the surface of a copper foil which satisfies a variety of requirements demanded for the copper foil used in printed wire boards, which prevent brown spottings, and prevent the decrease of peel strength due to fire retardants.

The present invention is mainly characterized in that the copper foil, of which the surface is preliminarily roughened, is electrolytically treated in an aqueous solution of zinc chromate containing caustic alkalis to form a colorless to pale brown zinc chromate coating on said copper foil. Said aqueous solution of zinc chromate containing caustic alkalis electrolytic treatment solution, contains zinc ions in a concentration of 1.0 to 20 g/l and chromium (VI) ions at a concentration of 1.0 to 20 g/l. To achieve better results, the copper foil is then immersed in an aqueous solution containing aminosilane at a concentration of 5 to 15 g/l and sodium silicate and/or potassium silicate at a concentration of 10 to 20 g/l after the above described electrolytic treatment.

The present invention will be described more in detail below.

The salts of zinc, which are soluble in an aqueous solution containing caustic alkalis, such as zinc, zinc oxide and zinc sulfate are used as the source of zinc ions. They are dissolved in the form of sodium zincate ($Na[Zn(OH)_3]$) or potassium zincate ($K[Zn(OH)_3]$).

Zinc ions at a concentration of below 1 g/l make it difficult to prevent the generation of brown spottings and also makes it difficult to form a zinc chromate coating having excellent flame retardant resistance. Further, an insufficient concentration of Zn ions deteriorates the the electrolytically treated copper foil after heat treatment and simultaneously the heat resistance is remarkably deteriorated in soldering operations, etc. The copper foils electrolytically treated with Zinc ions of 1 g/l or less can not be used in mult-layer glass/epoxy printed wiring boards and fire resistant paper/phenolic printed wiring boards.

On the other hand zinc at a concentration of above 20 g/l are apt to lead to the deposit of metallic zinc thereby forming coatings showing insufficient flame retardant properties. Consequently, copper foil electrolytically treated in said electrolytic treatment solution containing zinc ions at a conentration of above 20 g/l, can not be used in flame resistance type paper phenolic laminates. Furthermore, said coating is apt to alter its properties after a lapse of time, thereby it does not serve to prevent brown spottings when used in multi-layered printed wiring boards after about 30 days or more.

Chromic anhydride or dichromates and chromates of alkaline metals, preferably salts of chromium (VI), which are soluble in aqueous solutions containing caustic alkalis, such as sodium salts or potassium salts are used as the source of chromium (VI) ions. They are dissolved in the form of sodium dichromate or potassium dichromate.

Chromium (VI) ions at a concentration of below 1 g/l lead to the deterioration of the fire retardant properties thereby copper foil, electrolytically treated with such insufficient chromium (VI) ions can not be used in flame resistant paper/phenol printed wire boards. In addition, copper foil, electrolytically treated with insufficient chromium (VI) ions does not prevent brown spottings from occurring over a period of time when preserved under normal conditions.

Further, chromium (VI) ions at a concentration of below 20 g/l tend to reduce the of zinc ion content in the resulting zinc chromate coating deteriorating thereby the peel strength of the copper foil is after heat treatment and soldering, and also brown spottings can not always be prevented completely from occurring.

Caustic soda or caustic potash may be used as the caustic alkalis, caustic soda being preferably used industrially. The concentration of caustic soda in said electrolytic treatment solution according to the present invention is preferably held in the range of 30 to 100 g/l in order to maintain the stability of said electrolytic treatment solution.

The optimum cathodic current density and electrolysis time can be easily selected by means of a "Hullcell Check", which has been frequently used in the field of plating, for an aqueous solution of zinc chromate containing caustic alkalis in the composition.

Although said electrolytic treatment solution can form a coating having a stable quality over a wide range of cathodic current density and electrolysis time, a copper foil, electrolytically treated at a cathodic current density of 0.5 A/dm$^2$ or less, can not prevent brown spottings from occurring and simultaneously the flame retardant properties are deteriorated, thereby making it not practical to use such foils in multi-layer glass epoxy printed wire boards and flame resistant paper phenol printed wire boards. In addition, zinc chromate coatings, which are formed at a cathodic current density of 20 A/dm$^2$ or more, are not homogeneous in appearance and quality. Moreover, the bath possesses an elevated voltage and a decreased current efficiency, which are not preferable.

The current density is preferably selected so that hydrogen may be generated from the copper foil as the cathode in said electrolytic treatment solution, because the copper foil, which was preliminarily roughened, is washed before the electrolytic treatment. Since time an oxide coating layer is formed on the surface of the copper foil during the washing step etc., the resulting oxide coating layer is cleaned and activated by the action of the resulting hydrogen and simultaneously a zinc chromate coating is formed when it is subjected to the electrolytic treatment according to the present invention.

A copper foil, which is electrolytically treated in said electrolytic treatment solution for 1 second less, is not coated with a zinc chromate coating which exhibits excellent fire retardant properties and preventing brown spottings from occurring. In addition, metallic zinc is apt to be segregated on the electrolytically treated copper foil, after electrolytic treatment for 60 seconds or more, and such copper foil has reduced corrosion resistance against flame retardants, therefore such copper foil can not be practically used in flame resistant type printed wire boards.

Accordingly, the electrolysis time should be 1 to 60 seconds according to the present invention; the electrolysis time of 2 to 10 seconds being preferred on an industrial basis.

An insoluble anode made of a material selected from a group consisting of stainless steel, nickel, lead alloy, platinum and the like is preferably used as the anode in the surface treatment of the present invention.

Although the reasons why the zinc chromate coatings according to the present invention exhibit novel properties have never been clear, it is thought that the complex layer of co-deposited zinc compounds (zinc hydroxide, zincate) and chromium (VI) compounds and chromium (III) compounds (chromium hydroxide, chromate) formed on the surface of the copper foil, which was preliminarily roughened, imparts the novel characteristics thereto.

A copper foil, a such as electrolytic copper foil, rolled copper foil, and the like, preliminarily roughened may be used in the present invention. The copper foil may be preliminarily roughened by means of any one of the conventional methods. However, a method, in which the copper foil is electrolyzed in an electrolytic bath containing a complex salt of copper citrate with triethanolamine added therein to roughen the surface thereof, and a method, in which the copper foil is electrolyzed in the same electrolytic bath as the method described above in which Ni ions are additionally contained to roughen the surface thereof, are preferably used. These methods serve to prevent brown spottings from occurring and enhance the corrosion resistance of the foil against flame retardants.

It may be, however, that the advantage of the above described methods of roughening the surface of the copper foil results from the fact that the fine and adhesive roughened surface layer of copper, which was formed by electrolyzing the copper foil in an electrolytic bath containing a complex salt of copper citrate with triethanolamine added therein, consists of peculiar oxide including a nitrogen-containing chelate and the subsequent electrolytic treatment leads to the formation of a complex zinc chromate coating consisting of zinc compounds. This is and chromium compounds in addition to the fact that the corrosion resistance of the roughened grayish brown surface layer of the copper foil consisting of co-deposited nickel compounds and copper compounds, which was formed by electrolyzing in an electrolytic treatment bath containing complex salt of nickel-copper citrate, can be improved by the subsequent electrolytic treatment. In this time it is necessary to form the highly adhesive and alkaline etchant soluble roughened surface layer on the copper foil by electrolyzing it in the weakly acidic (pH of 2 to 5) electrolytic treatment bath containing triethanolamine at a concentration of 1 g/l or more, nickel ions at a concentration of 8 to 40 g/l (in the form of $NiSO_4.7H_2O$ at a concentration of 40 to 200 g/l), copper ions at a concentration of 4 to 50 g/l (in the form of $CuSO_4.5H_2O$ at a concentration of 14 to 213 g/l) and citric acid with a molar ratio of copper ions to nickel ions of 0.4 to 1.2. The application of a "critical current or more density" at which hydrogen begins to be generated, leads to an easier formation of the aimed roughened surface.

The surface roughening treatment engenders the formation of dendrites or nodules on the matte surface of the copper foil by the above described electrolytic treatment.

The resulting zinc chromate coating can be improved in the function of preventing the peel strenght from decreasing owing to the action of fire retardants by the following immersion treatment, the conditions of this immersion treatment being as follows:

(a) The immersion solution comprises aminosilane at a ratio of 5 to 10 g/l and sodium silicate and/or potassium silicate at a ratio of 10 to 20 g/l.

(b) a pH of 11 to 12

(c) A temperature of 25° C. or more (d) A time of 5 seconds or more

The immersion treatment of zinc chromate coating under the above described conditions leads to the stabilization of the peel strength, with a higher peel strength even at high temperature and high humidity conditions, when soldered at high temperatures (550° F. or more)(-see Table 4). Also, such problems such as the undercutting of conductors, delamination and the like can be eliminated by such immersion treatment. Aminosilane used in said immersion solution is limited to N-β(aminoethyl)γ-aminopropyl-trimethoxy silane.

Such a positive effect resulting from this immersion treatment can be attained with copper foil coated with zinc chromate according to the present invention, but can not be attained with copper foil treated by other methods.

EXAMPLES OF THE INVENTION

Examples of the present invention and those of the conventional arts are listed in Tables I to III.

The test results of various characteristics are listed in Tables IV to V.

Three methods of roughening the surface of the copper foil used in the present invention are listed in Table I (1st process).

Two examples of methods of forming zinc chromate coating according to the present invention and two examples of those of the prior arts are listed in Table II (2nd process).

Examples of the final immersion treatment are shown in Table III (3rd process).

The test results of FR4 base laminates with a copper foil treated under the conditions shown in Tables I to III, showing examples of the present invention (specimens 1-12) and the copper foil treated according to the prior arts (specimens a-f) stuck on both sides thereof are shown in Table IV in respect to the peel strength and brown spotting characteristics after etching (see Note 3).

The test results of FR2 base laminates with the copper foil treated under the conditions shown in Tables I to III show the examples of the present invention (specimens 1-12) and the copper foil treated according to the prior arts (specimens a-f) stuck on both sides thereof are shown in Table V in respect to peel strength, resistance and brown spotting after etching.

It is clear from Table IV, that the copper foil obtained according to the present invention, does not develop brown spottings in multi-layer glass/epoxy printed wire boards even after storing under the usual conditions for a long term of 6 to 12 months. The higher peel strength is not lost, even after various kinds of heat treatment. In particular, the remarkably higher peel strength can be attained by the treatment of zinc chromate coating with aminosilane.

Furthermore, it is clear from Table V that flame resistant paper phenol printed wire boards, in which the copper foil treated according to the present invention is used, show a remarkably higher peel strength and solder resistance. In addition, copper clad laminates using the copper foil treated according to the present invention satisfy fundamental requirements such as chemical resistance (acid resistance, alkali resistance, plating solution resistance, solvent resistance and the like), etching properties, corrosion resistance, heat resistance and the like demanded, which properties are required for the usual copper clad laminates for use in printed wire boards.

Thus, the copper foil for use in printed wire boards produced according to the present invention can be satisfactorily used in printed wire boards for use in high class electronic instruments, for which high density and high fidelity are required, and as flame resistant type printed wiring boards, not to mention the general printed wiring boards consisting of synthetic resin substrates.

An additional anticorrosive treatment, which is carried out after the surface treatment of the present invention, does not spoil the effects of the present invention.

It can be easily analogized that the present invention may be applied, not only to the copper foil, but also to conductive materials for use in printed wiring boards made of other metals to exhibit the same effects.

TABLE 1

| Pretreatment | |
|---|---|
| Method - A | |
| Cupric sulfate pentahydrate | 50 g/l |
| Sodium citrate | 130 g/l |
| Triethanolamine | 10 g/l |
| Temperature | 45° C. |
| Cathodic Current Density | 10 A/dm$^2$ |
| Time | 12 Sec |
| Anode | Cu |
| Method - B | |
| Nickel sulfate heptahydrate | 80 g/l |
| Cupric sulfate pentahydrate | 40 g/l |
| Sodium citrate | 150 g/l |
| pH | 3.5 |
| Temperature | 60° C. |
| Cathodic Current Density | 10 A/dm$^2$ |
| Time | 5 Sec |
| Anode | Cu |
| Method - C | |
| Cupric sulfate pentahydrate | 120 g/l |
| Sulfaric acid | 80 g/l |
| Nitric acid | 30 g/l |
| Temperature | 50° C. |
| Cathodic Current Density | 20 A/dm$^2$ |
| Time | 60 Sec |
| Anode | Cu |

TABLE 2

| Alkaline Zinc Chromate Treatment | |
|---|---|
| Bath No. (2-A) Example (This invention) | |
| Zinc oxide (as $Zn^{2+}$) | 4 g/l |
| Chromium trioxide (as $Cr^{6+}$) | 10 g/l |
| Sodium hydroxide | 80 g/l |
| Temperature | 45° C. |
| Cathodic Current density | 2 A/dm$^2$ |
| Time | 15 Sec. |
| Bath No. (2-B) Example (This invention) | |
| Zinc sulfate (as $Zn^{2+}$) | 8 g/l |
| Potassium dichromate (as $Cr^{6+}$) | 20 g/l |
| Sodium hydroxide | 60 g/l |
| Temperature | 35° C. |
| Cathodic current density | 10 A/dm$^2$ |
| Time | 5 Sec. |
| Bath No. (2-C) Example (Prior art) | |
| Chromium trioxide (as $Cr^{6+}$) | 7 g/l |
| Temperature | 35° C. |

TABLE 2-continued

| Alkaline Zinc Chromate Treatment | |
|---|---|
| Cathodic current density | 0.3 A/dm² |
| Time | 5 Sec. |
| Bath No. (2-D) Example (Prior art) | |
| Sodium cyanide | 110 g/l |
| Sodium hydroxide | 60 g/l |
| Copper Cyanide | 90 g/l |
| Zinc Cyanide | 5.3 g/l |
| Temperature | 50° C. |
| Cathodic current density | 5.4 A/dm² |
| Time | 10 Sec. |

TABLE 3

| Aminosilane Treatment | |
|---|---|
| Bath No. (3-A) Example | |
| N—β(Amino ethyl)γ-aminopropyl-tri methoxy silane $H_2N(CH_2)_2NH(CH_2)_3Si(OCH_3)_3$ | 10 g/l |
| Sodium silicate (water glass) $Na_2O \cdot nSiO_2 \cdot \chi H_2O$ | 20 g/l |
| pH | 11–12 |
| Temperature | 45° C. |
| Time | 15 Sec. |
| Bath No. (3-B) Example | |
| N—β(Amino ethyl)γ-aminopropyl-tri methoxy silane | 8 g/l |
| Potassium silicate (soluble potash glass) $K_2Si_2O_5$, $K_2Si_3O_7$ | 10 g/l |
| pH | 10–12 |
| Temperature | 30° C. |
| Time | 5 Sec. |

TABLE 4

Characteristics of copper foil bonded onto both side of FR-4 base laminates for multi-layer use.

| | Treatment process | | | Peel strength (kg/cm) | | | | | Brown spotting after etching (After heat aging at 150° C. 30 minutes) Aging period of copper foil | | | | |
|---|---|---|---|---|---|---|---|---|---|---|---|---|---|
| Specimens | 1st Treatment layer | 2nd Treatment layer | 3rd Treatment layer | Condiment A | After solder float 260° C. 20 Sec. | After thermal stress 288° C. 10 Sec. | After heat aging 150° C. 10 days (UL-796) | After pressure cooker 2 kg/cm² 120 min. | Within 24 hours | 10 days | 30 days | 60 days | 180 days |
| Examples of this invention | | | | | | | | | | | | | |
| 1 | A | 2-A | 3-A | 1.95 | 2.00 | 2.00 | 1.63 | 1.95 | O | O | O | O | O |
| 2 | B | " | " | 2.20 | 2.10 | 2.20 | 1.95 | 2.05 | O | O | O | O | O |
| 3 | C | " | " | 2.25 | 2.20 | 2.20 | 1.50 | 2.10 | O | O | O | O | O |
| 4 | A | " | — | 1.75 | 1.80 | 1.80 | 1.65 | 1.38 | O | O | O | O | O |
| 5 | B | " | — | 2.00 | 2.05 | 1.95 | 1.88 | 1.30 | O | O | O | O | O |
| 6 | C | " | — | 2.00 | 2.10 | 2.10 | 1.37 | 1.45 | O | O | O | O | O |
| 7 | A | 2-B | 3-B | 2.00 | 2.05 | 2.10 | 1.80 | 2.00 | O | O | O | O | O |
| 8 | B | " | " | 2.15 | 2.10 | 2.20 | 1.90 | 2.05 | O | O | O | O | O |
| 9 | C | " | " | 2.10 | 2.15 | 2.10 | 1.45 | 2.00 | O | O | O | O | O |
| 10 | A | " | — | 1.88 | 1.95 | 1.90 | 1.75 | 1.45 | O | O | O | O | O |
| 11 | B | " | — | 2.00 | 1.95 | 2.00 | 1.88 | 1.45 | O | O | O | O | O |
| 12 | C | " | — | 1.88 | 2.05 | 1.95 | 1.38 | 1.35 | O | O | O | O | O |
| Examples of prior art | | | | | | | | | | | | | |
| a | A | 2-C | — | 1.75 | 1.80 | 1.80 | 0.70 | 1.25 | O | X | X | X | X |
| b | B | " | — | 1.88 | 1.80 | 1.95 | 0.75 | 1.20 | O | X | X | X | X |
| c | C | " | — | 1.88 | 1.90 | 1.85 | 0.63 | 1.10 | O | X | X | X | X |
| d | A | 2-D | — | 1.88 | 1.90 | 1.95 | 1.50 | 1.45 | O | Δ | Δ | Δ | Δ |
| e | B | " | — | 1.88 | 1.95 | 1.90 | 1.50 | 1.35 | O | Δ | Δ | Δ | Δ |
| f | C | " | — | 1.88 | 1.95 | 1.95 | 1.50 | 1.40 | O | Δ | Δ | Δ | Δ |

TABLE 5

Characteristics of copper foil bonded to both side of FR-2 base laminates.

| | Treatment process | | | | Peel strength (kg/cm) | | Brown spotting after etching (Aging period of copper foil is within 24 hours) | |
|---|---|---|---|---|---|---|---|---|
| Specimens | 1st treatment layer | 2nd treatment layer | 3rd treatment layer | Condition A | After solder float 260° C. 5 Sec. | Solder resistance (second) | As received | After heat aging 150° C. |
| Examples of this invention | | | | | | | | |
| 1 | A | 2-A | 3-A | 1.8–1.9 | 1.8–1.9 | 25–30 | O | O |
| 2 | B | " | " | 1.8–1.9 | 1.8–1.9 | 30–35 | O | O |
| 3 | C | " | " | 1.9–2.0 | 1.8–1.9 | 25–30 | O | O |
| 4 | A | " | — | 1.8–2.0 | 1.8–1.9 | 25–30 | O | O |
| 5 | B | " | — | 1.8–1.9 | 1.8–1.9 | 25–30 | O | O |
| 6 | C | " | — | 1.9–2.1 | 1.8–1.9 | 25–30 | O | O |
| 7 | A | 2-B | 3-B | 1.8–1.9 | 1.8–1.9 | 25–30 | O | O |
| 8 | B | " | " | 1.9–2.0 | 1.9–2.0 | 30–35 | O | O |
| 9 | C | " | " | 2.0–2.1 | 2.0–2.2 | 25–30 | O | O |
| 10 | A | " | — | 1.8–1.9 | 1.8–1.9 | 25–30 | O | O |
| 11 | B | " | — | 1.9–2.0 | 1.9–2.0 | 25–30 | O | O |
| 12 | C | " | — | 2.0–2.1 | 1.7–1.9 | 20–25 | O | O |
| Examples of prior art | | | | | | | | |
| a | A | 2-C | — | 1.9–2.5 | 1.0–1.2 | 5–10 | Δ | X |
| b | B | " | — | 1.5–1.6 | 1.2–1.5 | 10–15 | Δ | X |

TABLE 5-continued

Characteristics of copper foil bonded to both side of FR-2 base laminates.

| | Treatment process | | | Peel strength (kg/cm) | | Solder resistance (second) | Brown spotting after etching (Aging period of copper foil is within 24 hours) | |
|---|---|---|---|---|---|---|---|---|
| Specimens | 1st treatment layer | 2nd treatment layer | 3rd treatment layer | Condition A | After solder float 260° C. 5 Sec. | | As received | After heat aging 150° C. |
| c | C | " | — | 1.0–1.2 | 0.5–1.0 | 5–10 | O | X |
| d | A | 2-D | — | 1.2–1.4 | 0.5–1.0 | 5–10 | Δ | X |
| e | B | " | — | 1.2–1.5 | 0.5–1.0 | 5–10 | Δ | X |
| f | C | " | — | 1.2–1.5 | 0.5–1.0 | 5–10 | O | Δ |

Note 1.
Peel strength; The strip widths are 3 mm except for 0.8 mm of 'After heat aging'.
Note 2.
Aging period; Copper foils stored under a condition of 40° C.–65° C. RH before hot-pressed onto base laminate.
Note 3.
Brown spotting; The base laminate, on which copper foil is etched away by commercially available etchants such as ferric chloride and ammonium persulfate, is heated in an oven at 150° C. for 30 minutes. The base laminate surface is then visually examined for brown spottings. The criteria of the brown spottings is as follows:
O: Clean (acceptance).
Δ: Light brown spottings are partly observed. (rejection)
X: Dark brown spottings are observed all over the surface (rejection).

What is claimed is:

1. A method of treating the surface of a copper foil used in printed wire boards comprising the steps of preliminarily roughing the surface of the copper foil, electrolytically treating the copper foil as a cathode in an aqueous solution of zinc chromate containing zinc ions at a concentration of 1.0 to 20 g/l, chromium VI ions at a concentration of 1.0 to 20 g/l and caustic alkalis under conditions sufficient to coat the roughened copper surface with a coating of chromium and zinc.

2. A method according to claim 1 in which the copper foil is electrolytically treated for 1 to 60 seconds at a cathodic current density of 0.5 to 20 A/dm$^2$.

3. A method according to claim 1 in which the copper foil is preliminarily roughened by being electrolytically treated at a current density in which hydrogen is generated at the surface of the cathode, said electrolytic roughening treatment being carried out in an aqueous solution of a complex salt of copper citrate with triethanolamine present at a concentration of at least 1 g/l.

4. A method according to claim 1 in which the copper foil is preliminarily roughened by being subject to an electrolytic treatment as a cathode in an aqueous solution of a complex salt of nickel-copper citrate containing nickel ions in a concentration of 8 to 40 g/l and copper ions at a concentration of 4 to 50 g/l with a molar ratio of copper ions to nickel ions of 0.4 to 1.2, said electrolytic treatment being carried out under such conditions that hydrogen is generated at the surface of the cathode.

5. A method of treating the surface of a copper foil used in printed wire boards comprising:

preliminarily roughening the surface of the copper foil;

electrolytically treating the thus-roughened copper foil as a cathode in an aqueous solution of zinc chromate with caustic alkalis added therein, said aqueous solution containing zinc ions at a concentration of 1.0 to 20 g/l and chromium VI ions at a concentration of 1.0 to 20 g/l; and immersing the resulting zinc chromate coating in a solution containing amino silane at a concentration of 5 to 15 g/l and the silicate selected from the group consisting of sodium silicate, potassium silicate and mixtures thereof at a concentration of 10 to 20 g/l.

6. A method according to claim 5 in which the copper foil is electrolytically treated for 1 to 60 seconds at a cathodic current density of 0.5 to 20 A/dm$^2$.

7. A method according to claim 5 in which the copper foil is preliminarily roughened by electrolytically treating the copper foil as a cathode in an aqueous solution of a complex salt of copper citrate with triethanolamine added therein at a concentration of 1 g/l or more under such current density conditions that hydrogen is generated at the surface of the copper foil.

8. A method according to claim 5 in which the copper foil is preliminarily roughened by being electrolytically treated as a cathode in an aqueous solution of a complex salt of nickel-copper citrate containing nickel ions at a concentration of 8 to 40 g/l and copper ions at a concentration of 4 to 50 g/l at a molar ratio of the copper ions to the nickel ions of 0.4 to 1.2.

* * * * *